US009007805B2

(12) United States Patent
Lu et al.

(10) Patent No.: US 9,007,805 B2
(45) Date of Patent: Apr. 14, 2015

(54) PROGRAMMABLE DIODE ARRAY FOR HIGH DENSITY OTP APPLICATION

(71) Applicant: Broadcom Corporation, Irvine, CA (US)

(72) Inventors: Yong Lu, Edina, MN (US); Roy Milton Carlson, Plymouth, MN (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/042,608

(22) Filed: Sep. 30, 2013

(65) Prior Publication Data

US 2015/0078062 A1 Mar. 19, 2015

Related U.S. Application Data

(60) Provisional application No. 61/879,611, filed on Sep. 18, 2013.

(51) Int. Cl.
*G11C 17/06* (2006.01)
*H01L 27/112* (2006.01)

(52) U.S. Cl.
CPC .......... *G11C 17/06* (2013.01); *H01L 27/11206* (2013.01)

(58) Field of Classification Search
CPC .. G11C 16/0416; G11C 2216/10; G11C 7/20; G11C 13/0007; G11C 13/0023; G11C 13/0069; G11C 2013/0073
USPC .................... 365/148, 149, 158, 163, 185.01, 365/185.04, 225.6
See application file for complete search history.

(56) References Cited

U.S. PATENT DOCUMENTS

2011/0298054 A1* 12/2011 Luan .............................. 257/369

OTHER PUBLICATIONS

Li, et al., "Evaluation of SiO2 Antifuse in a 3D-OTP Memory," IEEE Transactions on Device and Materials Reliability, Sep. 2004, pp. 416-421, vol. 4, No. 3.

* cited by examiner

*Primary Examiner* — Thong Q Le
(74) *Attorney, Agent, or Firm* — McDermott Will & Emery LLP

(57) ABSTRACT

A device for one-time-programmable (OTP) memory may include a capacitor formed by a conductive layer, an oxide layer, and a semiconductor well, and a diode that is formed after programing the device. The device may be programmable by applying a voltage between the conductive layer and the semiconductor well. The applied voltage may be capable of rupturing the oxide layer at one or more points. The conductive layer, the oxide layer, and the semiconductor well may be native CMOS process formations.

20 Claims, 6 Drawing Sheets

| 316 | NW |
| --- | --- |
| 312 | PMET |
| 315 | N+ |
| ▇ | Buried oxide |

US 9,007,805 B2

PROGRAMMABLE DIODE ARRAY FOR HIGH DENSITY OTP APPLICATION

CROSS-REFERENCE TO RELATED APPLICATIONS

This application claims the benefit of priority under 35 U.S.C. §119 from U.S. Provisional Patent Application 61/879,611 filed Sep. 18, 2013, which is incorporated herein by reference in its entirety.

TECHNICAL FIELD

The present description relates generally to memory, and more particularly, but not exclusively, to programmable diode array for high density one-time programmable (OTP) application.

BACKGROUND

In one-time programmable (OTP) memory, which is a form of digital memory, the setting of memory bits may be locked by using a fuse or an anti-fuse for each bit. Most OTP memories may require a programmable fuse element along with a select device (e.g., a switch), implementation of which can limit the cell density and may often increase process integration complexity. Many select devices are realized using thick oxide layers, which can limit scaling from one technology node to the next. For example, some of the existing OTP memory architectures may not be extendable to the advanced FinFet technology node.

Existing OTP memories use transistor anti-fuses that after programming may ideally form a diode-connected transistor where the gate is shorted to the channel through a point of rupture in the oxide layer that can act as a drain terminal. The anti-fuse cells may be realized by using thin or split-oxide layers. The thin-oxide anti-fuse cells typically need a select device for proper operation, therefore, cannot be used in cross-point diode array configurations, as it can form an ohmic contact directly to the source instead of forming a diode connected transistor. Split-oxide anti-fuse cells may be used in cross-point diode array configurations without a select device, but the cell structure may not be extendable to FinFet technology node. The split-oxide anti-fuse cells require the mix of thin and thick oxide devices in a single cell, which can reduce cell density, complicate process integration, and may not be applicable to advanced technology nodes such as FinFet.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more implementations. In one or more instances, well-known structures and components are shown in block diagram form in order to avoid obscuring the concepts of the subject technology.

The subject technology is directed to a programmable diode array for high density application. The programmable diode array may comprise a one-time-programmable (OTP) memory array. The OTP memory array may be a cross-point array, each cell of which can be programmed and read without a select device. The subject technology has a number of advantageous features. At the circuit level, for example, smaller cell size, higher density, and better scaling between technology generations are among the advantages. At the system level, the advantageous features may include more portability between different process technologies and foundries, reduction in fuse development and qualification time, and better security.

Figure 1A:
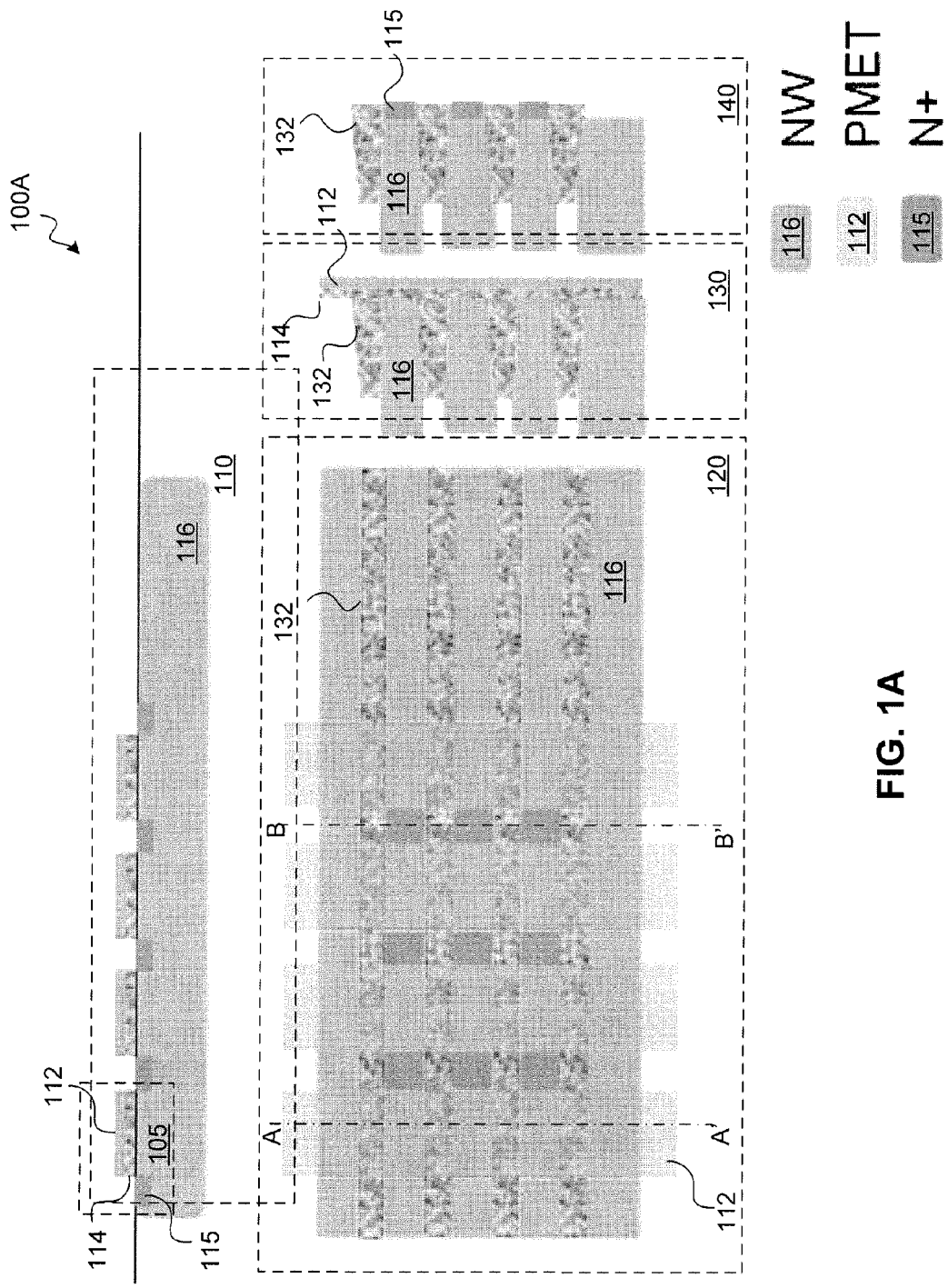
FIGS. 1A-1C illustrate examples of a memory cell and array structure, a circuit diagram, and programming selectivity of a high-density one-time programmable (OTP) diode array in in accordance with one or more implementations.
Figure 1B:
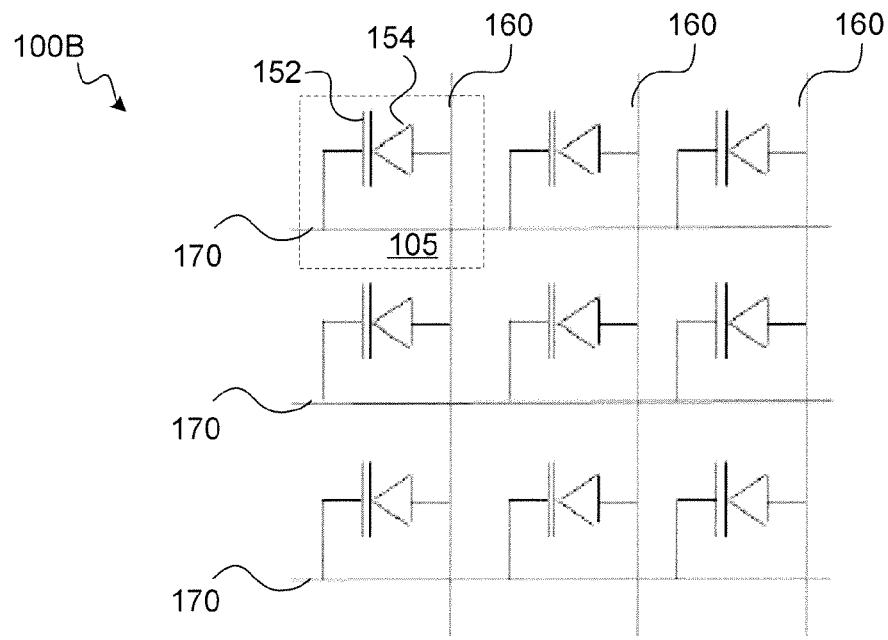
Figure 1C:
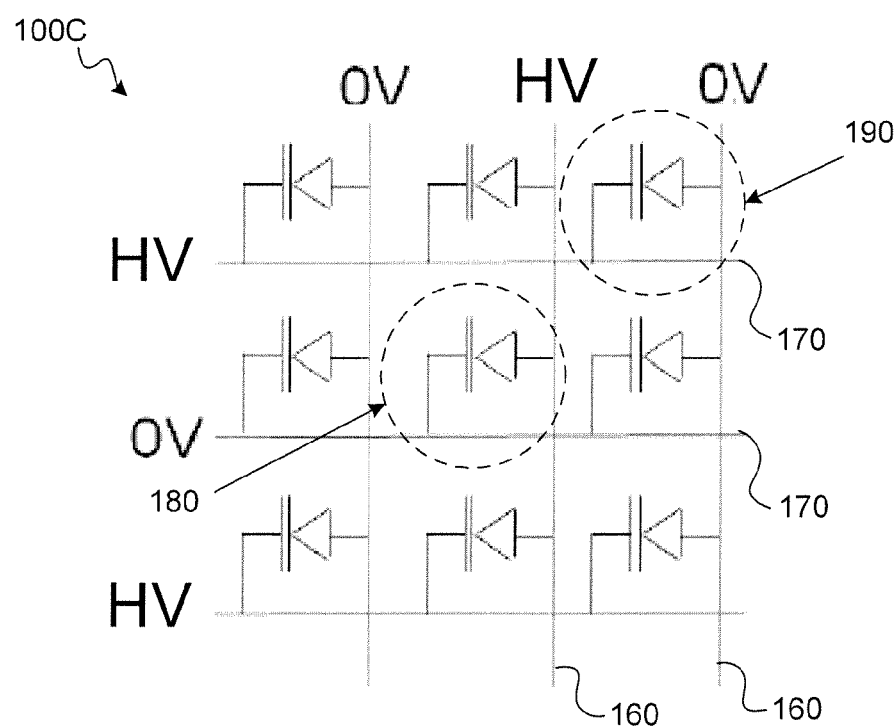

FIGS. 1A-1C illustrate examples of a memory cell and array structure 100A, a circuit diagram 100B, and a programming selectivity diagram 100C of a high-density OTP diode array in accordance with one or more implementations of the subject technology. A number of devices (e.g., memory cells) 105 of the OTP diode array of the subject technology are shown in a cross-sectional view 110. Each device 105 may include a capacitor formed by a conductive (e.g., metal) layer 112 (e.g., P-metal), an oxide layer 114, and an N$^+$ contact 115 of a semiconductor well (e.g., N-well) 116. The structure of each device 105 may allow for a diode to be formed after programing the device. The device 105 may be programmed by applying a voltage between the P-metal 112 and the N-well 116 (e.g., the N$^+$ contact 115 of the semiconductor well 116) that is capable of rupturing the oxide layer 114 at least at one point to allow formation of the diode. The P-metal 112, the oxide layer 114, the N$^+$ contact 115, and the N-well 116 can be native CMOS process formations. In some aspects, the device may be compatible with the advanced technology nodes such as the FinFet technology.

The programmable device 105 can be read without a select device when used in a cross-point OTP diode array (e.g., 100B). For the device 105, the metal layer 112 is a P-metal that after rupturing of the oxide layer 114 can form the diode with the N-well. The device 105 may be formed by using normal design-rule checking (DRC) without a need for any special DRC rules. In one or more implementations of the subject technology, a programmable diode array may include a number of devices 105 (e.g., memory cells), multiple row lines and multiple column lines. A top view 120 of the OTP diode array shows strips of the P-metal 112 that forms the column lines of the diode array. The row lines of the diode array are formed by the N+ contacts 115, as shown in the cross-sectional view 140 across the line BB' shown in the top view 120. The cross-sectional view 140 and the cross-sectional view 130 (across the line AA' shown in the top view 120) show the shallow trench isolation (STI) regions 132. The STI region 132, a native CMOS process formation, may be formed by silicon dioxide (SiO2), and may have a thickness of a few hundred nanometers. The diode array may be independent of the underlying process technologies. For example, the diode array formation may be compatible with planar processes as well as the vertical processes used, for example, in FinFet technology.

The circuit diagram 100B shown in FIG. 1B depicts a number of memory cells arranged in a two dimensional diode array. Each memory cell (e.g., 105) is shown to include a capacitor 152 (e.g., formed by the P-metal 112, an oxide layer 114, and the N-well 116 of FIG. 1A), and a diode 154 (e.g., a schottky diode) that is formed after programing the memory cell 105 by applying a voltage between the P-metal 112 and the N-well 116 (e.g., formed by crystalline silicon) that is capable of rupturing (at least at one point) the oxide layer 114. Each row line 170 may be formed by connecting contacts 115 of FIG. 1 incorporated into the N-wells 116 of the memory cells of the corresponding row. Each column line 160 may be formed by coupling the P-metals 112 associated with the memory cells of the corresponding column.

The programming selectivity diagram 100C shown in FIG. 1C depicts a selected cell 180 and other non-selected memory cells (e.g., 190). The selected memory cell 180 is programmed by applying a first voltage (e.g., low voltage, such as 0V) to the corresponding row line 170 and a second voltage (e.g., HV) to the corresponding column line 160. The applied HV (e.g., program-HV) is high enough (e.g., 5V) to be able to rupture the oxide layer 114 and to provide a diode, between the P-metal 112 and the N-well 116 that is biased in an accumulation mode. The other non-selected memory cells are not programmed since they are biased in ether the depletion mode (e.g., in case of non-selected memory cell 190), in which the applied HV (e.g., 5V) is dropped on a depletion layer (e.g., not on oxide layer 114), or not biased, as their corresponding row lines and column lines are both coupled to the applied HV (e.g., 5V), therefore the oxide layer cannot be ruptured to create the diode.

A programmed memory cell (e.g., 180) may be read, without a select device, by applying a first voltage (e.g., a low voltage, such as 0V) to the corresponding row line 170 and a HV (e.g., a read-HV, such as 0.8V) to the corresponding column line 160. The applied read-HV (e.g., 0.8V) can forward bias the diode 154 of the programmed memory cell 180 so an associated read current can be sensed. However, in the non-programmed memory cells, the applied read-HV either drops on the depletion layer (e.g., as in 190) or there is no bias voltage, as both the row line 170 and the column line 160 are coupled to the same voltage. Therefore, upon applying the suitable bias voltages (e.g., 0.8 and 0V), only the programmed memory cell is read (e.g., generates a read current).

Figure 2A:
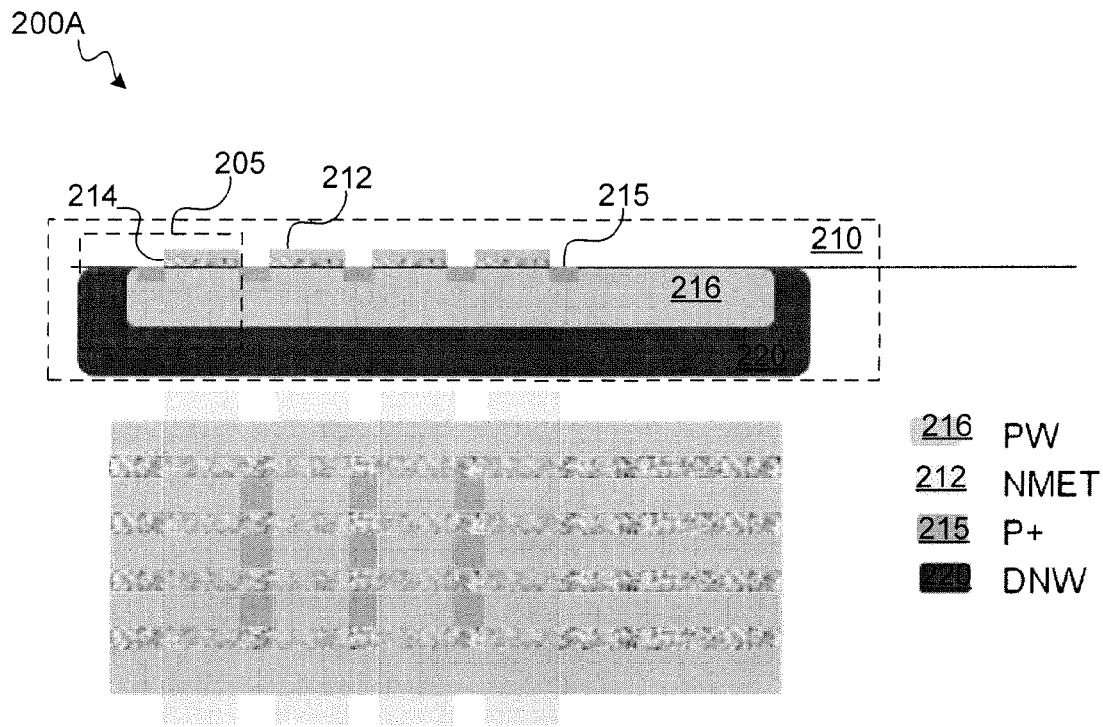
FIGS. 2A-2B illustrate examples of a memory cell and array structure and a programming selectivity diagram of a high-density OTP deep N-well (DNW) diode array in accordance with one or more implementations.
Figure 2B:
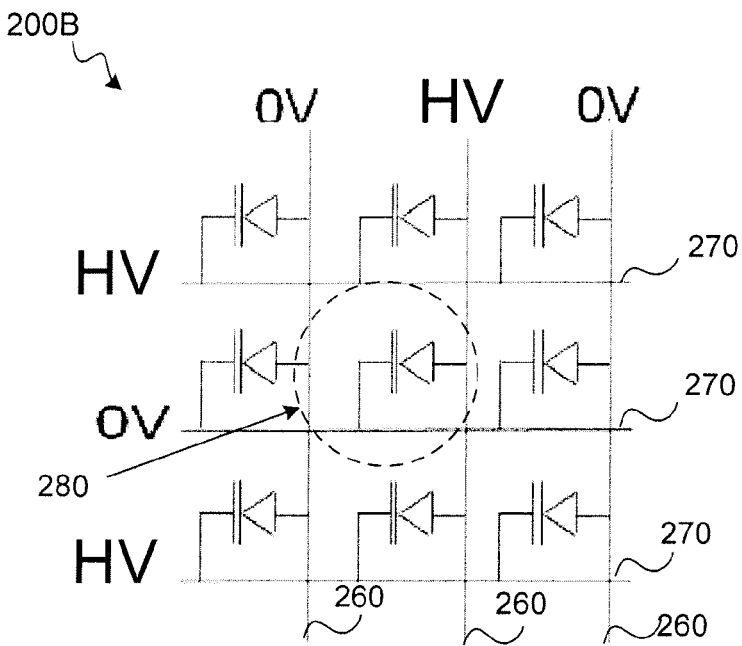

FIGS. 2A-2B illustrate examples of a memory cell and array structure 200A and a programming selectivity diagram 200B of a high-density OTP deep N-well (DNW) diode array in accordance with one or more implementations of the subject technology. A number of devices (e.g., memory cells) 205 of the OTP DNW diode array of the subject technology are shown in a cross-sectional view 210. Similar to the memory cell 105 of FIG. 1A, each device 205 may include a capacitor formed by a conductive layer 212 (e.g., N-metal), an oxide layer 214, and a P+ contact 215 of a semiconductor well (e.g., P-well) 216. The structure of each device 205, as discussed above with respect to the device 105, may allow for a diode to be formed after programing the device. The device 205 is similar to device 105 and the difference is that the N-well of device 105 is replaced, in device 205, by the P-well 216 that is embedded in a DNW 220, as shown in FIG. 2A. The N-metal 212, the oxide layer 214, the P+ contact 215, the P-well 216, and the DNW 220 can be native CMOS process formations. In some aspects, the device may be compatible with the advanced technology nodes such as the FinFet technology.

The programming selectivity diagram 200B is similar to the 100C of FIG. 1C, except that the column lines 260 are formed by coupling the P+ contacts 215 of the P-wells 216 and the row lines 270 are formed by coupling the N-metals 212 of the corresponding memory cells 205. The applied HVs (e.g., 5V for programming and 0.8V for reading the programmed memory cell) and low voltages (e.g., 0V) are similarly applied for programming and reading (e.g., without a select device) the programmed memory cell (e.g., 208).

Figure 3A:
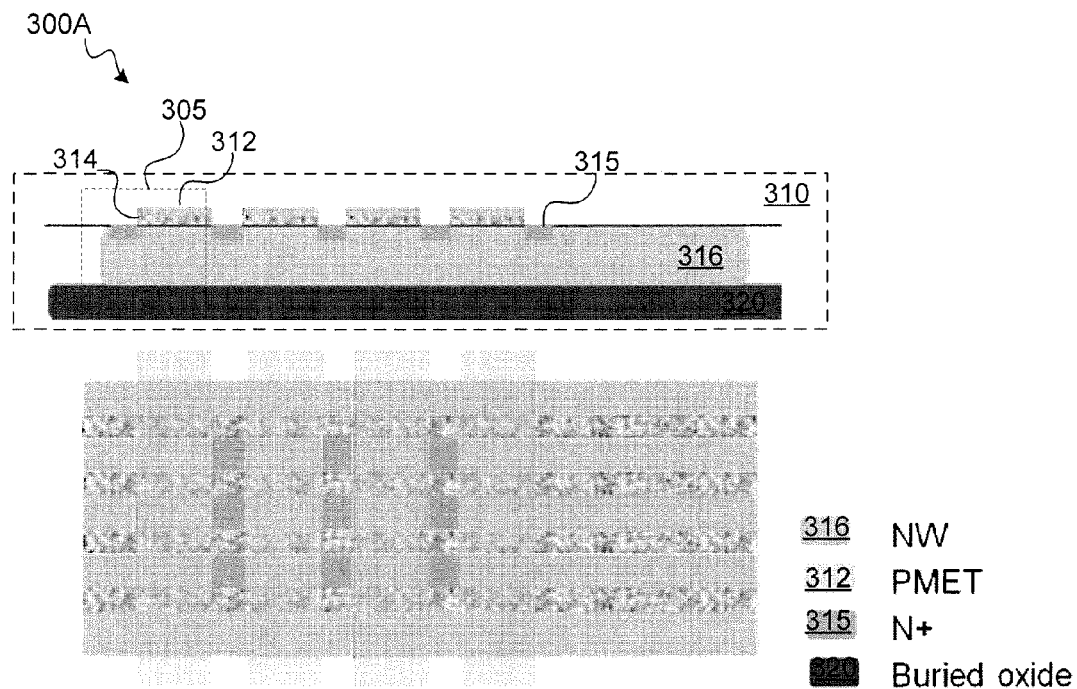
FIGS. 3A-3B illustrate examples of a memory cell and array structure and a programming selectivity diagram of a high-density OTP silicon-on-insulator (SOI) diode array in accordance with one or more implementations.
Figure 3B:
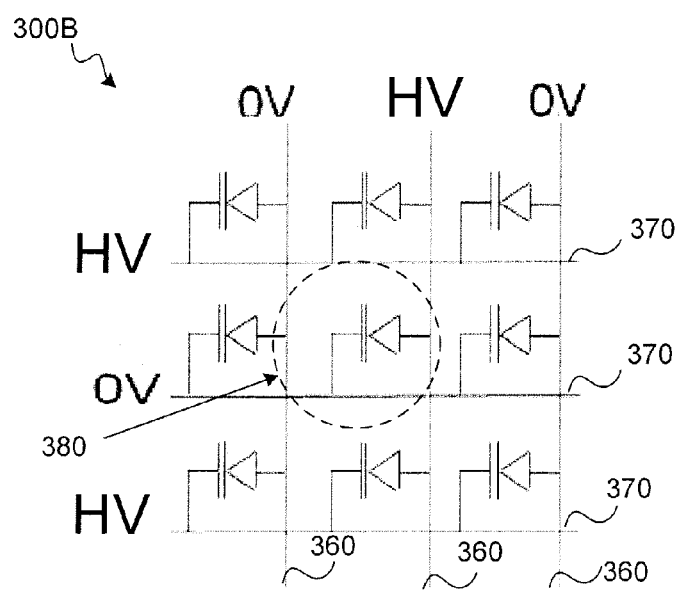

FIGS. 3A-3B illustrate examples of a memory cell and array structure 300A and a programming selectivity diagram 300B of a high-density OTP silicon-on-insulator (SOI) diode array in accordance with one or more implementations of the subject technology. A number of devices (e.g., memory cells) 305 of the OTP SOI diode array of the subject technology are shown in a cross-sectional view 310. Similar to the memory cell 105 of FIG. 1A, each device 305 may include a capacitor formed by a conductive layer 312 (e.g., P-metal), an oxide layer 314, and an N+ contact 315 of a semiconductor well (e.g., N-well) 316. The structure of each device 205, as discussed above with respect to the device 105, may allow for a diode to be formed after programing the device. The device 305 is similar to device 105 and the difference is that the N-well 316 of device 305 is formed on a buried oxide layer 320, as shown in FIG. 3A. The P-metal 312, the oxide layer 314, the N+ contact 315, the N-well 316, and the DNW 220 can be native CMOS process formations. In some aspects, the device may be compatible with the advanced technology nodes such as the FinFet technology.

The programming selectivity diagram 300B is similar to the 100C of FIG. 1C, and the column lines 360 are formed by coupling the P-metals 312 and the row lines 270 are formed by coupling the N+ contacts 315 of the N-wells 316 of the corresponding memory cells 305. The applied HVs (e.g., 5V for programming and 0.8V for reading the programmed memory cell) and low voltages (e.g., 0V) are similarly applied for programming and reading (e.g., without a select device) a programmed memory cell (e.g., 308).

Figure 4:
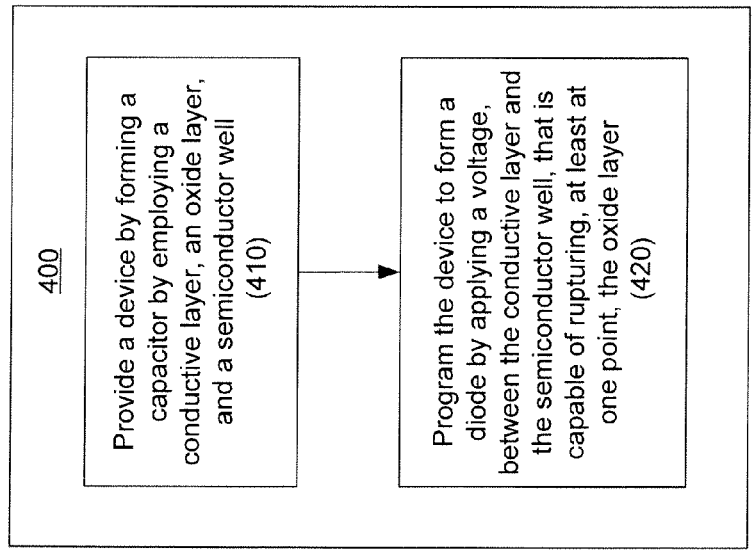
FIG. 4 illustrates an example method for providing OTP memory in accordance with one or more implementations.

FIG. 4 illustrates an example method 400 for providing OTP memory in accordance with one or more implementations of the subject technology. The steps of the method 400 do not need to be performed in the order shown and one or more steps may be omitted. A device (e.g., 105 of FIG. 1A) may be provided by forming a capacitor (e.g., 152 of FIG. 1B) by employing a conductive layer (e.g., 112 of FIG. 1A), an oxide layer (e.g., 114 of FIG. 1A), and a semiconductor well (e.g., 116 of FIG. 1A) (410). The device may be programmed to form a diode (e.g., 154 of FIG. 1B) by applying a voltage (e.g., 5V) between the conductive layer and the semiconductor well that is capable of rupturing, at least at one point, the oxide layer (420). The conductive layer, the oxide layer, and the semiconductor well may include native CMOS process formations.

Figure 5:
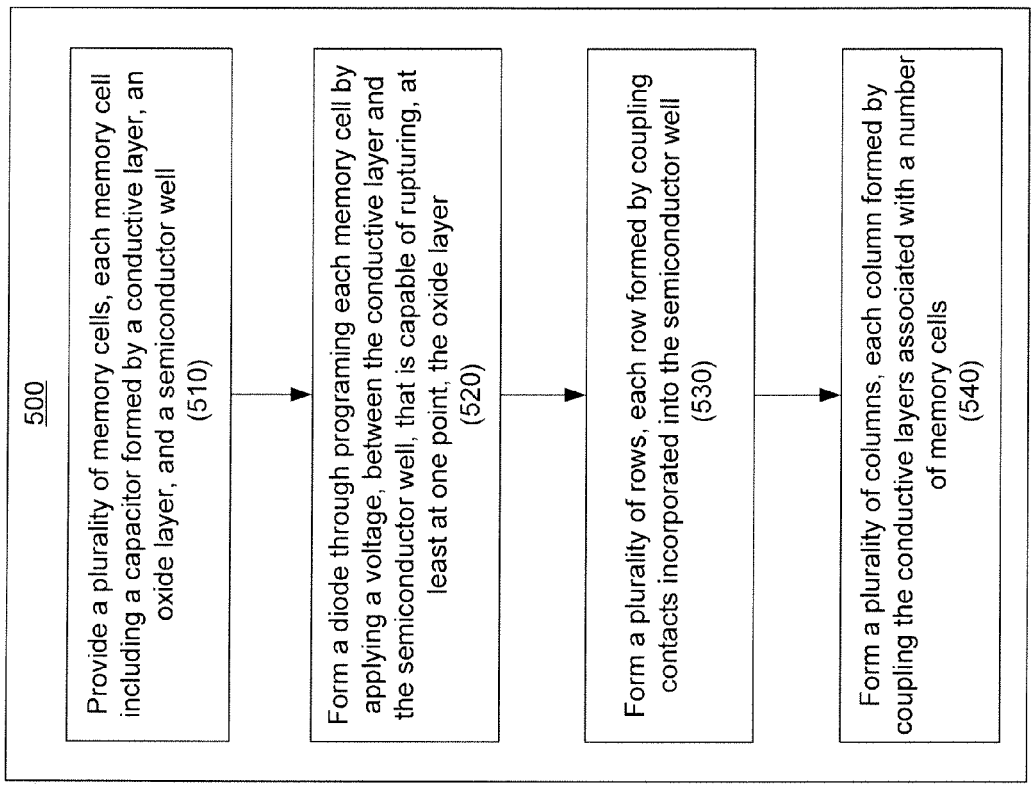
FIG. 5 illustrates an example method for providing a programmable diode array in accordance with one or more implementations.

FIG. 5 illustrates an example method 500 for providing a programmable diode array (e.g., 100B of FIG. 1B) in accordance with one or more implementations of the subject technology. The steps of the method 500 do not need to be performed in the order shown and one or more steps may be omitted. Multiple memory cells (e.g., 105 of FIG. 1A) may be provided, where each memory cell may include a capacitor (e.g., 152 of FIG. 1B) formed by a conductive layer (e.g., 112 of FIG. 1A), an oxide layer (e.g., 114 of FIG. 1A), and a semiconductor well (e.g., 116 of FIG. 1A) (510). A diode (e.g., 154 of FIG. 1A) may be formed through programing each memory cell by applying a voltage (e.g., 5V), between the conductive layer and the semiconductor well, that is capable of rupturing, at least at one point, the oxide layer (520). A number of row lines (e.g., 170 of FIG. 1B) may be formed by coupling contacts (e.g., 115 of FIG. 1A) incorporated into the semiconductor well (530). A number of column lines (e.g., 160 of FIG. 1A) may be formed by coupling the conductive layers associated with the memory cells (540).

Figure 6:
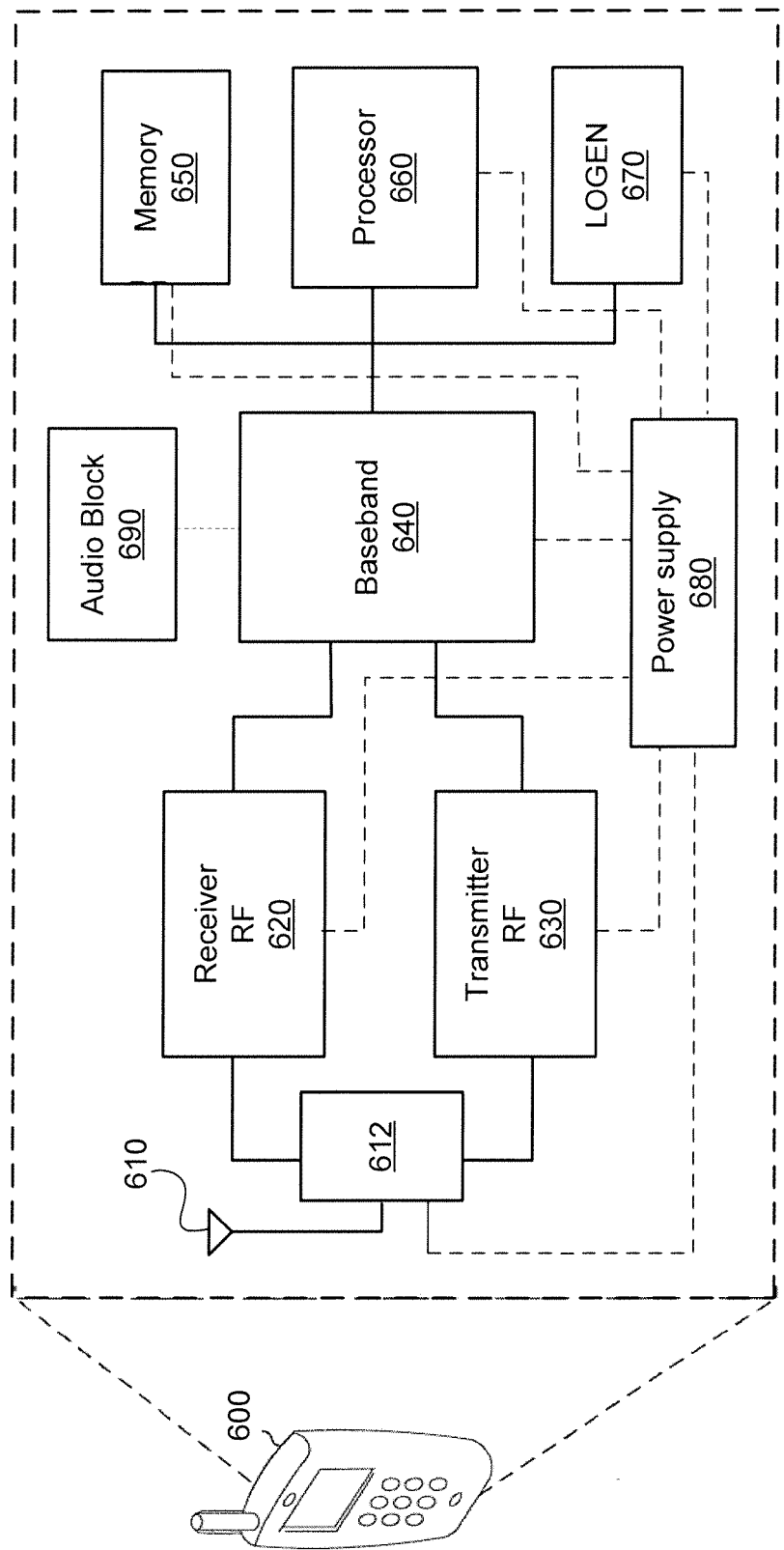
FIG. 6 illustrates an example wireless communication device in accordance with one or more implementations.

FIG. 6 illustrates an example wireless communication device 600 in accordance with one or more implementations of the subject technology. The wireless communication device 600 may comprise a radio-frequency (RF) antenna 610, a receiver 620, a transmitter 630, a baseband processing module 640, a memory 650, a processor 660, a local oscillator generator (LOGEN) 670, and a power supply 680. In various embodiments of the subject technology, one or more of the blocks represented in FIG. 6 may be integrated on one or more semiconductor substrates. For example, the blocks 620-670 may be realized in a single chip or a single system on chip, or may be realized in a multi-chip chipset.

The RF antenna 610 may be suitable for transmitting and/or receiving RF signals (e.g., wireless signals) over a wide range of frequencies. Although a single RF antenna 610 is illustrated, the subject technology is not so limited.

The receiver 620 may comprise suitable logic circuitry and/or code that may be operable to receive and process signals from the RF antenna 610. The receiver 620 may, for example, be operable to amplify and/or down-covert received wireless signals. In various embodiments of the subject technology, the receiver 620 may be operable to cancel noise in received signals and may be linear over a wide range of frequencies. In this manner, the receiver 620 may be suitable for receiving signals in accordance with a variety of wireless standards. Wi-Fi, WiMAX, Bluetooth, and various cellular standards. In various embodiments of the subject technology, the receiver 620 may not require any SAW filters and few or no off-chip discrete components such as large capacitors and inductors.

The transmitter 630 may comprise suitable logic circuitry and/or code that may be operable to process and transmit signals from the RF antenna 610. The transmitter 630 may, for example, be operable to up-covert baseband signals to RF signals and amplify RF signals. In various embodiments of the subject technology, the transmitter 630 may be operable to up-convert and amplify baseband signals processed in accordance with a variety of wireless standards. Examples of such standards may include Wi-Fi, WiMAX, Bluetooth, and various cellular standards. In various embodiments of the subject technology, the transmitter 630 may be operable to provide signals for further amplification by one or more power amplifiers.

The duplexer 612 may provide isolation in the transmit band to avoid saturation of the receiver 620 or damaging parts of the receiver 620, and to relax one or more design requirements of the receiver 620. Furthermore, the duplexer 612 may attenuate the noise in the receive band. The duplexer may be operable in multiple frequency bands of various wireless standards.

The baseband processing module 640 may comprise suitable logic, circuitry, interfaces, and/or code that may be operable to perform processing of baseband signals. The baseband processing module 640 may, for example, analyze received signals and generate control and/or feedback signals for configuring various components of the wireless communication device 600 such as the receiver 620. The baseband processing module 640 may be operable to encode, decode, transcode, modulate, demodulate, encrypt, decrypt, scramble, descramble, and/or otherwise process data in accordance with one or more wireless standards.

The processor 660 may comprise suitable logic, circuitry, and/or code that may enable processing data and/or controlling operations of the wireless communication device 600. In this regard, the processor 660 may be enabled to provide control signals to various other portions of the wireless communication device 600. The processor 660 may also control transfers of data between various portions of the wireless communication device 600. Additionally, the processor 660 may enable implementation of an operating system or otherwise execute code to manage operations of the wireless communication device 600.

The memory 650 may comprise suitable logic, circuitry, and/or code that may enable storage of various types of information such as received data, generated data, code, and/or configuration information. The memory 650 may comprise, for example, RAM, ROM, flash, and/or magnetic storage. In various embodiment of the subject technology, Information stored in the memory 650 may be utilized for configuring the receiver 620 and/or the baseband processing module 640.

In one or more implementations, the memory 650 may include an OTP diode array (e.g., 100B of FIG. 1B), each cell of which can be programmed and read without a select device. The memory 640 may benefit from a number of advantageous features of the disclosed OTP diode array, for example, smaller cell size, higher density, and better scaling between technology generations are among the advantages.

The local oscillator generator (LOG EN) 670 may comprise suitable logic, circuitry, interfaces, and/or code that may be operable to generate one or more oscillating signals of one or more frequencies. The LOGEN 670 may be operable to generate digital and/or analog signals.

Those of skill in the art would appreciate that the various illustrative blocks, modules, elements, components, and methods described herein may be implemented as electronic hardware, computer software, or combinations of both. To illustrate this interchangeability of hardware and software, various illustrative blocks, modules, elements, components, and methods have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples of the disclosure. A phrase such an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A device for one-time-programmable (OTP) memory, the device comprising:
    a capacitor formed by a conductive layer, an oxide layer, and a semiconductor well; and
    a diode that is formed after programing the device,
    wherein the device is programmable without using a select transistor by applying a voltage, between the conductive layer and the semiconductor well, that is capable of rupturing, at least at one point, the oxide layer, and wherein the conductive layer, the oxide layer, and the semiconductor well are native CMOS process formations.

2. The device of claim 1, wherein the device is compatible with advanced technology nodes including FinFet technology, and wherein the formed diode comprises a schottky diode formed between the conductive layer and single crystalline silicon.

3. The device of claim 1, wherein a programmed device is readable without using a select device when used in a cross-point OTP array.

4. The device of claim 1, wherein conductive layer comprises a P-metal or an N-metal, and wherein the semiconductor well comprises an N-well or a P-well.

5. The device of claim 1, wherein the device is formed with no special design-rule checking (DRC) rules.

6. The device of claim 1, wherein conductive layer comprises an N-metal, and wherein the semiconductor well comprises a P-well embedded in a deep N-well.

7. The device of claim 1, wherein conductive layer comprises a P-metal, and wherein the semiconductor well comprises an N-well that is formed on a buried oxide layer.

8. A programmable diode array, comprising:
    a plurality of memory cells;
    a plurality of row lines; and
    a plurality of column lines,
    wherein:
    each memory cell of the plurality of memory cells comprises a capacitor formed by a conductive layer, an oxide layer, and a semiconductor well and a diode that is formed after programming a memory cell, and
    the memory cell is programmable without using a select transistor by applying a voltage, between the conductive layer and the semiconductor well, that is capable of rupturing, at least at one point, the oxide layer, wherein each of the plurality of row lines is formed by coupling contacts incorporated into the semiconductor well, and wherein each column of the plurality of column lines is formed by coupling the conductive layers associated with a number of memory cells.

9. The programmable diode array of claim 8, wherein each memory cell of the plurality of memory cells is configured to be selectable for programming by applying a first voltage to a corresponding row and a second voltage to a corresponding column associated with that memory cell, wherein the semiconductor well comprises an N-well and the first and the second voltages comprise a low voltage and a program-high voltage, respectively.

10. The programmable diode array of claim 8, wherein each memory cell of the plurality of memory cells is configured to be selectable for reading by applying a first voltage to a corresponding row and a second voltage to a corresponding column associated with that memory cell, wherein the semiconductor well comprises an N-well and the first and the second voltages comprise a low voltage and a read-high voltage, respectively.

11. A method for providing one-time-programmable (OTP) memory, the method comprising:
    providing a device by forming a capacitor by employing a conductive layer, an oxide layer, and a semiconductor well; and programming the device to form a diode by applying a voltage, between the conductive layer and the semiconductor well, that is capable of rupturing, at least at one point, the oxide layer, wherein programming the device is performed without using a select transistor.

12. The method of claim 11, wherein providing the device comprises providing a device that is compatible with advanced technology nodes including FinFet technology, and wherein the formed diode comprises a schottky diode formed between the conductive layer and single crystalline silicon.

13. The method of claim 11, further comprising reading the programmed device, when used in a cross-point OTP array, without using a select device.

14. The method of claim 11, wherein employing the conductive layer comprises employing a P-metal or an N-metal, and wherein employing the semiconductor well comprises employing an N-well or a P-well.

15. The method of claim 11, wherein providing the device is achieved without special design-rule checking (DRC) rules.

16. The method of claim 11, wherein conductive layer comprises an N-metal, and wherein the employing semiconductor well comprises employing a P-well embedded in a deep N-well.

17. The method of claim 11, wherein employing the conductive layer comprises employing a P-metal, and wherein employing the semiconductor well comprises forming an N-well on a buried oxide layer.

18. A method for providing a programmable diode array, comprising:

providing a plurality of memory cells, wherein each memory cell of the plurality of memory cells comprises a capacitor formed by a conductive layer, an oxide layer, and a semiconductor well;

forming a diode through programing each memory cell by applying a voltage, between the conductive layer and the semiconductor well, that is capable of rupturing, at least at one point, the oxide layer, wherein programming each memory cell is performed without a select transistor;

forming a plurality of row lines, wherein each of the plurality of row lines is formed by coupling contacts incorporated into the semiconductor well; and forming a plurality of column lines, wherein each column of the plurality of column lines is formed by coupling the conductive layers associated with a number of memory cells.

19. The method of claim 18, further comprising configuring each memory cell of the plurality of memory cells to be selectable for programming by applying a first voltage to a corresponding row line and a second voltage to a corresponding column line associated with that memory cell, wherein the semiconductor well comprises an N-well and the first and the second voltages comprise a low voltage and a program-high voltage, respectively.

20. The method of claim 18, further comprising configuring each memory cell of the plurality of memory cells to be selectable for reading by applying a first voltage to a corresponding row line and a second voltage to a corresponding column line associated with that memory cell, wherein the semiconductor well comprises an N-well and the first and the second voltages comprise a low voltage and a read-high voltage, respectively.

* * * * *